United States Patent
Takekawa et al.

(10) Patent No.: US 10,040,219 B2
(45) Date of Patent: Aug. 7, 2018

(54) MOLD AND MOLD MANUFACTURING METHOD

(71) Applicant: Toshiba Memory Corporation, Tokyo (JP)

(72) Inventors: Yoko Takekawa, Miyagi (JP); Ryouichi Inanami, Kanagawa (JP); Masafumi Asano, Kanagawa (JP); Kazuhiro Takahata, Mie (JP); Sachiko Kobayashi, Tokyo (JP); Shigeki Nojima, Kanagawa (JP); Yohko Furutono, Kanagawa (JP); Masato Suzuki, Kanagawa (JP); Kenji Konomi, Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 1038 days.

(21) Appl. No.: 14/015,803

(22) Filed: Aug. 30, 2013

(65) Prior Publication Data
US 2014/0284846 A1    Sep. 25, 2014

(30) Foreign Application Priority Data
Mar. 25, 2013  (JP) .................. 2013-063101

(51) Int. Cl.
*B29C 33/42* (2006.01)
*B29C 33/00* (2006.01)
(Continued)

(52) U.S. Cl.
CPC ........ *B29C 33/0055* (2013.01); *B29C 33/424* (2013.01); *G03F 7/0002* (2013.01);
(Continued)

(58) Field of Classification Search
CPC .............. B29C 33/0055; B29C 33/422; B29C 2033/422
See application file for complete search history.

(56) References Cited

U.S. PATENT DOCUMENTS 7,309,225 B2 *  12/2007  McMackin  ............... G03F 1/60
                                                              264/1.36
7,794,222 B2 *   9/2010  Suehira  .................. B82Y 10/00
                                                              264/293
(Continued)

FOREIGN PATENT DOCUMENTS

JP    2010-145238        7/2010
JP    2011-159850 A      8/2011
(Continued)

OTHER PUBLICATIONS

Molecular Imprints: Technology and Applications : Jet and Flash™; http://www.molecularimprints.com/technology/j_fil_overview.php.
(Continued)

*Primary Examiner* — Atul P. Khare
(74) *Attorney, Agent, or Firm* — Patterson & Sheridan, LLP

(57) ABSTRACT

According to one embodiment, a mold includes a base, a first concave pattern, a second concave pattern, and a third concave pattern. The base includes a first surface and a pedestal projecting from the first surface. The pedestal includes a first region and a second region disposed outside the first region. The first concave pattern is formed in the first region. The second concave pattern is formed in the second region. The third concave pattern extends from the first region to the second region.

16 Claims, 19 Drawing Sheets

(51) Int. Cl.
  *G03F 7/00* (2006.01)
  *G03F 9/00* (2006.01)
  *B29C 59/02* (2006.01)
(52) U.S. Cl.
  CPC .......... *G03F 9/7042* (2013.01); *G03F 9/7076* (2013.01); *G03F 9/7084* (2013.01); *B29C 2033/422* (2013.01)

(56) References Cited

U.S. PATENT DOCUMENTS

| | | | |
|---|---|---|---|
| 8,052,414 B2 | 11/2011 | Wakamatsu et al. | |
| 8,236,231 B2* | 8/2012 | Ferguson | B29C 45/14016 264/328.16 |
| 8,361,371 B2* | 1/2013 | Khusnatdinov | B82Y 10/00 264/293 |
| 8,850,980 B2* | 10/2014 | Sreenivasan | B82Y 10/00 101/483 |
| 8,967,991 B2* | 3/2015 | Wuister | B82Y 10/00 425/150 |
| 2008/0303187 A1* | 12/2008 | Stacey | B29C 43/003 264/293 |
| 2009/0039140 A1 | 2/2009 | Bezama et al. | |
| 2009/0200710 A1* | 8/2009 | Khusnatdinov | B82Y 10/00 264/496 |
| 2010/0092599 A1* | 4/2010 | Selinidis | B82Y 10/00 425/470 |
| 2010/0252188 A1 | 10/2010 | Inanami et al. | |
| 2012/0315349 A1* | 12/2012 | Zhang | B29C 33/424 425/385 |

FOREIGN PATENT DOCUMENTS

| | | |
|---|---|---|
| JP | 2012-009686 A | 1/2012 |
| JP | 2012-035578 A | 2/2012 |

OTHER PUBLICATIONS

"A Novel Planar Floating-Gate (FG)/Charge-Trapping (CT) NAND Device Using BE-SONOS Inter-Poly Dielectric (IPD)", IEDM, 2009 IEEE.

Japanese Office Action with English translation, Patent Application No. JP 2013-063101, dispatch date May 21, 2015.

* cited by examiner

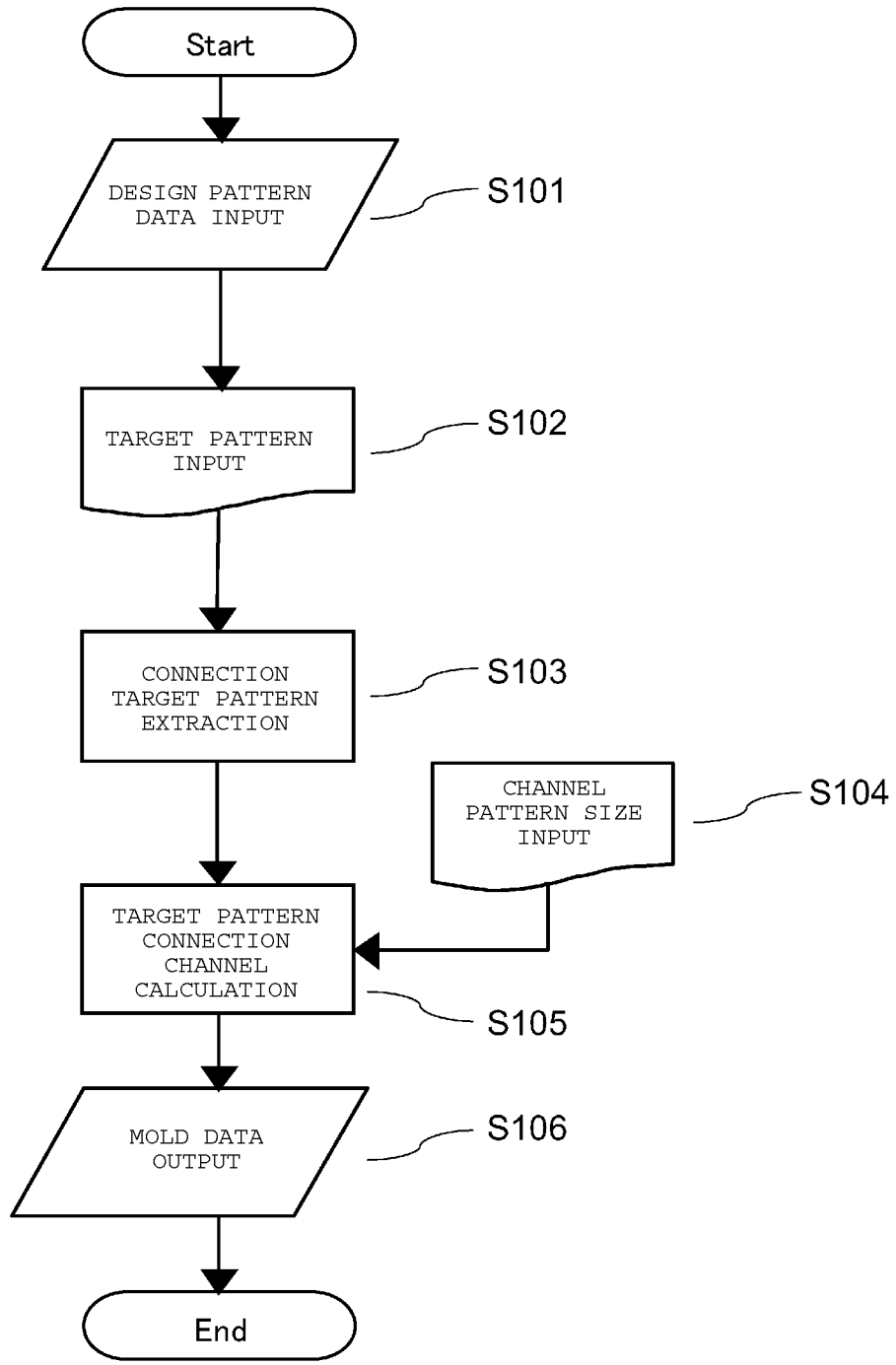

MOLD AND MOLD MANUFACTURING METHOD

CROSS-REFERENCE TO RELATED APPLICATION

This application is based upon and claims the benefit of priority from Japanese Patent Application No. 2013-063101, filed Mar. 25, 2013; the entire contents of which are incorporated herein by reference.

FIELD

Embodiments described herein relate generally to a mold or imprint template and a method of manufacturing using the mold, including a mold useful for imprinting patterns into a resist material used in etching of features used in the manufacturing of integrated circuit devices . . . .

BACKGROUND

Imprinting is attracting attention as a pattern forming method which uses an original mold or template (mold) having concavities (recesses) and convexities (protrusions or mesas) in correspondence with a pattern to be formed on a piece, such as a substrate. According to imprinting, light curable resin, for example, is applied to a substrate and brought into contact with a mold, in which condition light is applied to harden the resin. As a result, a pattern containing a reverse image of the concavities and convexities in the mold is transferred from the mold into the layer of the resin. For the mold used in this method, control of the expansion of the resin between the substrate and the mold is essential for achieving highly reliable transfer.

DESCRIPTION OF THE DRAWINGS

FIG. 6 is a flowchart showing a mold manufacturing method according to the first embodiment.

DETAILED DESCRIPTION

In general, according to one embodiment, there are provided a mold and a mold manufacturing method capable of controlling expansion or flow of a resin and thereby achieving highly reliable pattern transfer.

According to one embodiment, a mold includes a base, a first concave pattern, a second concave pattern, and a third concave pattern. The base includes a first surface and a pedestal projecting from the first surface. The pedestal includes a first region and a second region disposed outside the first region. The first concave pattern is formed in the first region. The second concave pattern is formed in the second region. The third concave pattern extends from the first region to the second region.

Embodiments are hereinafter described with reference to the drawings. In the following description, similar components are given similar reference numbers, and the same explanation of similar components once discussed is not repeated.

First Embodiment

Figure 1A:
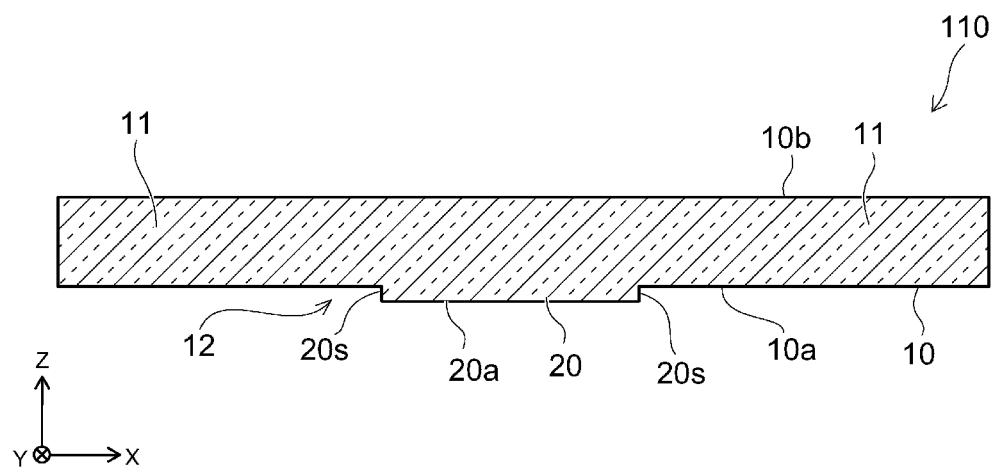
FIGS. 1A and 1B schematically illustrate an example structure of a mold according to a first embodiment.
Figure 1B:
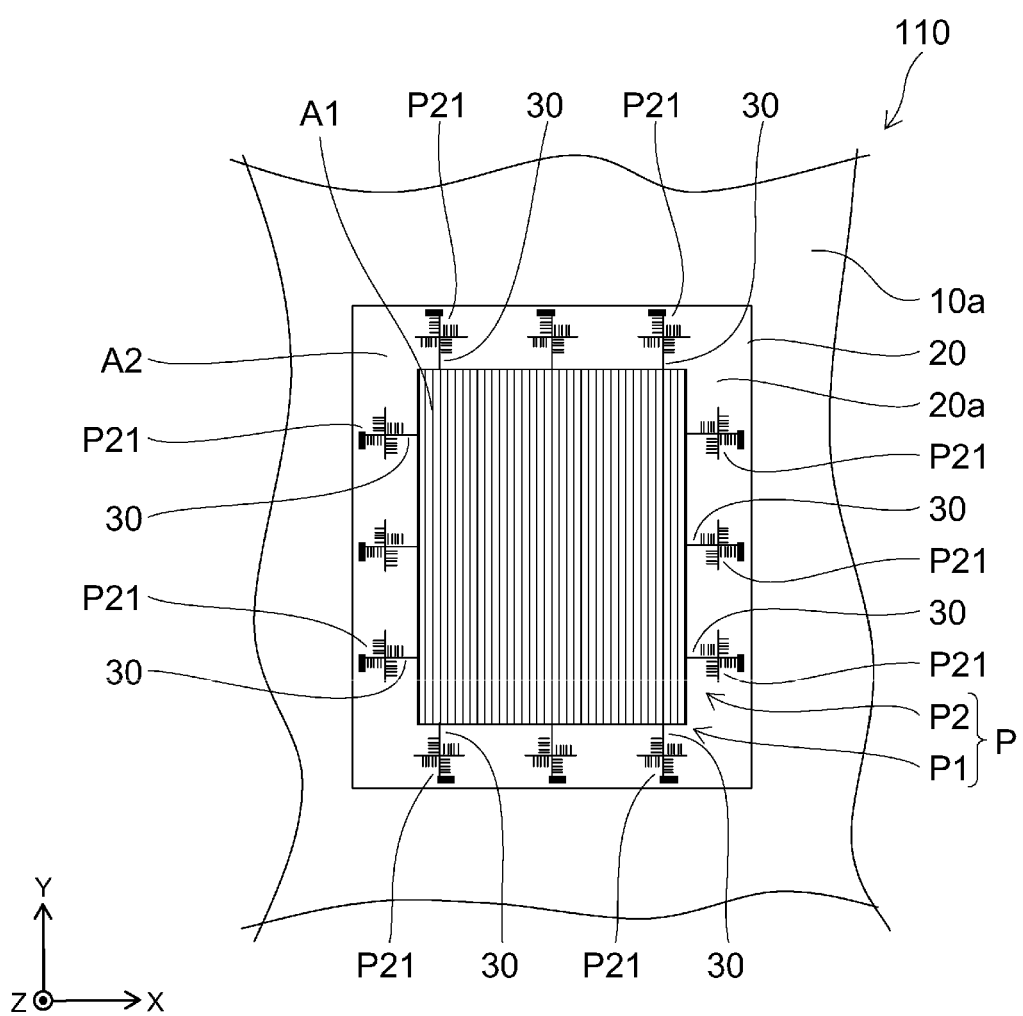

FIGS. 1A and 1B schematically illustrate an example structure of a mold according to a first embodiment.

FIG. 1A is a cross-sectional view schematically illustrating an example of the general structure of a mold 110, while FIG. 1B is a plan view schematically illustrating an enlarged pedestal 20.

As illustrated in FIG. 1A, the mold 110 in this embodiment includes a base 10 and a pattern area P. The mold 110 is an original mold used for forming patterns therewith by imprinting.

The base 10 has a first surface 10a and a second surface 10b. The second surface 10b is a surface disposed on the side opposite to the first surface 10a. According to this embodiment, the direction connecting the first surface 10a and the second surface 10b is defined as a Z direction. The Z direction also corresponds to the thickness direction of the base 10.

The base 10 has the pedestal 20 projecting from the first surface 10a. According to this embodiment, each external appearance of the base 10 and the pedestal 20 has a rectangular shape as viewed from the Z direction, for example. The four sides of the base 10 and the four sides of the pedestal 20 are each in the form of a rectangular shape and are arranged such that the corresponding sides of the two components 10 and 20 extend in parallel with each other, with the smaller of the rectangular profiles, that of the pedestal 20, disposed within the perimeter of the profile of the base 10. One of the four sides of the rectangular shape is defined as an X direction, while the direction perpendicular to the X direction in the plane of the base 10 upper surface 10 is defined as a Y direction.

The dimensions of the external shape of the base 10 as viewed in the Z direction are 150 millimeters (mm) in length and 150 mm in width, for example. A peripheral region 11 has a thickness of 6.4 mm, for example. A center region 12 has an additional thickness of 1 mm, i.e., the center region may have a total thickness of 7.4 mm, for example. The base 10 is made of a material having light transmissibility, for example. The base 10 is made of quartz, for example.

The pedestal 20 formed on, and projects outwardly from, the first surface 10a of the base 10 projects in the direction opposite to the second surface 10b. The pedestal 20 has a front surface 20a and side surfaces 20s. The front surface 20a is a surface projecting from the first surface 10a and extending in parallel with the first surface 10a, for example. The side surfaces 20s are surfaces extending in the Z direction.

The pedestal 20 is formed integrally with the base 10, for example. The pedestal 20 may be provided as a member independent of, and separately applied to, the base 10. The external appearance of the pedestal 20 as viewed in the Z direction has a rectangular shape, for example. The dimensions of the external shape of the pedestal 20 as viewed in the Z direction are 33 mm in length and 26 mm in width, for example. The height of the pedestal 20 is in the range from about 1 micrometer (μm) to about 100 μm, for example.

As illustrated in FIG. 1B, the pattern area P is disposed on the front surface 20a of the pedestal 20. The pattern area P includes a first region pattern P1 and a second region pattern P2, for example. The pedestal 20 has a first region A1 and a second region A2.

The first region A1 is a region disposed at the center of the front surface 20a when the front surface 20a is viewed in the Z direction. The first region A1 is a rectangular region, for example. The second region A2 is a region provided outside of, and around, the first region A1 when the front surface 20a is viewed in the Z direction.

The first region pattern P1 is formed in the first region A1. The first region pattern P1 of the mold 110 corresponds to a first concave pattern. The second region pattern P2 is formed in the second region A2. The second region pattern P2 of the mold 110 corresponds to a second concave pattern.

The first region pattern P1 and the second region pattern P2 of the pattern area P are used for producing patterns used in the manufacture of integrated circuits or other devices. The first region pattern P1 is a pattern used for forming circuit patterns of integrated circuits (such as wiring patterns, element patterns, and contact holes). On the other hand, the second region pattern P2 is a pattern used in many cases for forming patterns of various marks such as alignment marks and overlay metrology marks.

When the first region A1 has a rectangular shape, the lengths of the first region A1 in the X direction and in the Y direction are about 25 mm and about 32 mm, respectively. When the second region A2 has a frame shape which surrounds the outer periphery of the first region A1, the width of the second region A2 (distance between the periphery of the first region A1 and the periphery of the second region A2) is in the range from about 10 μm to about 200 μm.

The mold 110 has channels 30 extending from the first region A1 to the second region A2. The channels 30 of the mold 110 form a third concave pattern. The channels 30 are supplementary patterns for guiding or enabling flowing of a resin 70 from the first region A1 to the second region A2.

Figure 2A:
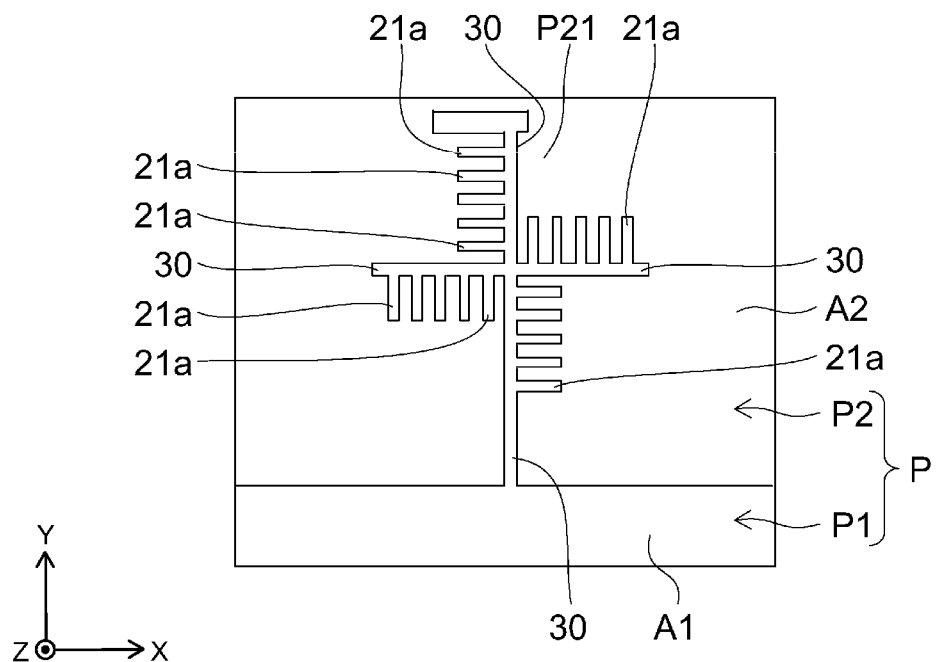
FIGS. 2A and 2B are plan views schematically illustrating an enlarged second region pattern.
Figure 2B:
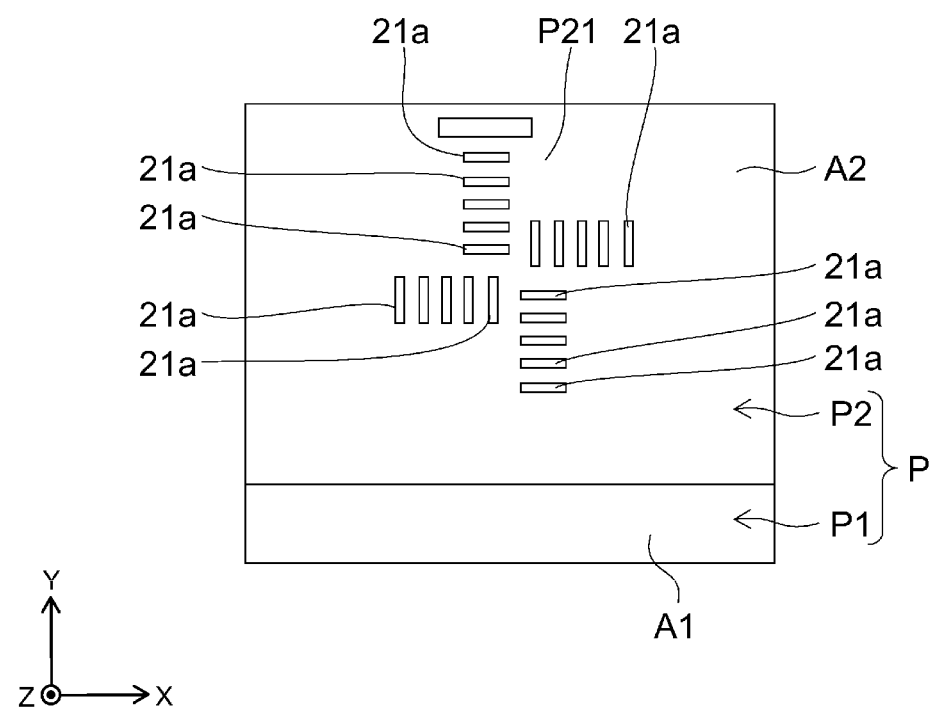

FIGS. 2A and 2B are plan views schematically illustrating the enlarged second region pattern P2.

FIG. 2A illustrates an example of a mark pattern P21 used for forming an alignment mark as the second region pattern P2, and the channel 30. FIG. 2B illustrates an example of the mark pattern P21.

As illustrated in FIG. 2B, the mark pattern P21 has a plurality of small features, or patterns 21a, for example. The small patterns 21a are concave patterns. Each of the small patterns 21a has an oblong shape as viewed in the Z direction, for example. Each length of the small patterns 21a in the direction of the long side thereof is about 3 μm, for example. Each length of the small patterns 21a in the direction of the short side thereof is about 1 μm. Each of the mark patterns P21 is formed by a predetermined layout of the plural small patterns 21a. Each depth (first depth) of the small patterns 21a is in the range from about 10 nanometers (nm) to 200 nm, for example.

As illustrated in FIG. 2A, the channel 30 extending from the first region A1 to the second region A2 communicates with the plural small patterns 21a, for example. The width of the channel 30 is larger than the width of the pattern features in the first region pattern P1, for example, and larger than the width of the features in the second region pattern P2, for example. The width of the channel 30 is 1 μm. for example. The width of the channel 30 may be substantially equivalent to the width of the second region pattern P2. The depth of the channel 30 (second depth) is in the range from about 10 nm to about 200 nm, for example. Each depth of the respective patterns is measured by a step gauge, an AFM (atomic force microscope), or an X-ray photoelectron spectroscopic analyzer, for example.

The channels 30 of the mold 110 extend from the first region A1 to the second region A2. In this case, the resin 70 easily expands or flows from the first region A1 to the second region A2 via the channels 30 during an imprinting step as described below. More specifically, the resin 70 applied to the first region A1 passes through the channels 30 and easily expands from the first region A1 to the second region A2 when imprinted by the mold 110. The resin 70 radically expands or flows from the first region A1, for example, and fills the second region pattern P2 (such as mark pattern P21) of the second region A2 after passing through the channels 30.

If the channels 30 are not provided, the resin 70 does not easily reach the second region pattern P2 of the second region A2 from the first region A1 and fill the second region pattern P2 within a predetermined time. In this case, a larger amount of the resin 70 is required if the second region pattern P2 of the second region A2 is desired to be filled with the resin 70 coming from the first region A1 within the predetermined time. However, the resin 70 may overflow from the second region A2 when the amount of the resin 70 increases.

In the case of the mold 110, however, the channels 30 allow the resin 70 to reliably reach the second region A2 of the pedestal 20 to which the resin 70 does not otherwise easily flow. When the second region A2 has the mark pattern P21, the resin 70 fills the plural small patterns 21a. Moreover, the necessity of increasing the amount of the resin 70 is eliminated, wherefore overflow of the resin 70 from the second region A2 can be avoided.

The mark pattern 21 is not limited to the example shown in FIG. 2B.

FIGS. 3A through 3D are plan views schematically illustrating examples of other mark patterns.

Figure 3A:
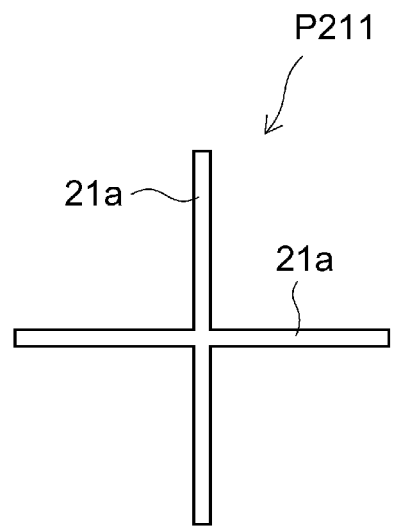
FIGS. 3A through 3D are plan views schematically illustrating examples of other mark patterns.
Figure 3B:
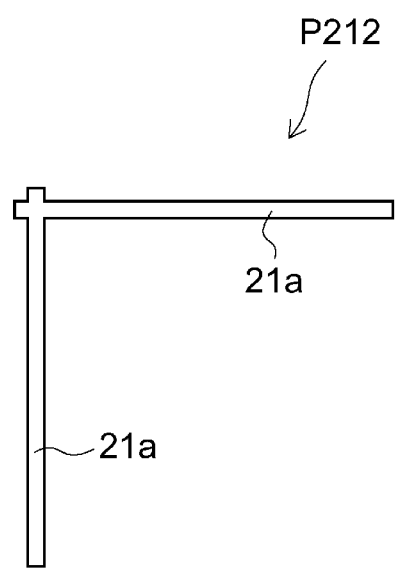
Figure 3C:
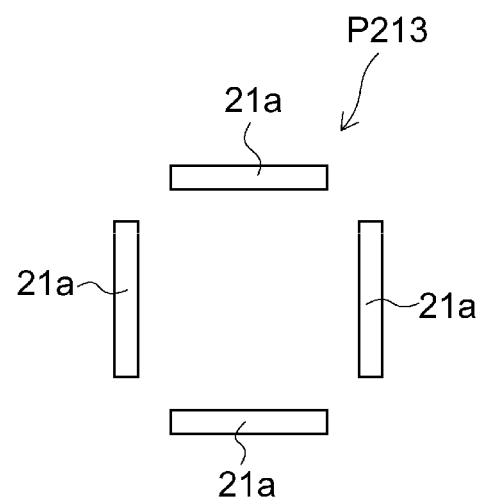
Figure 3D:
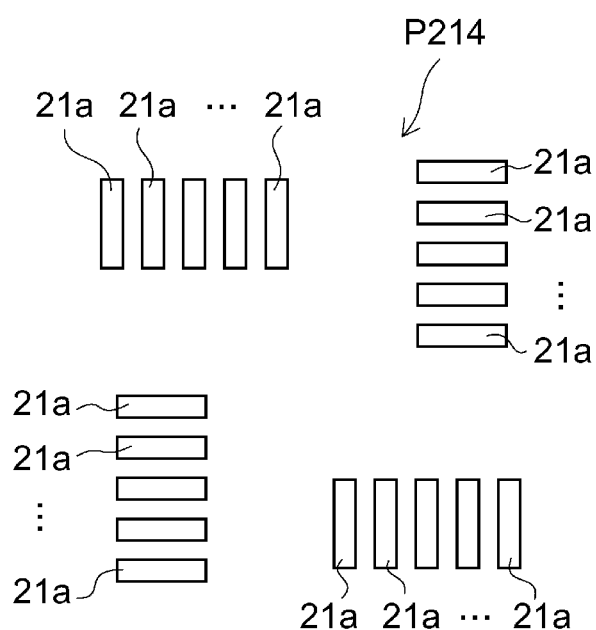

FIG. 3A shows a mark pattern P211. The overall shape of the mark pattern P211 is a cross shape constituted by the two small patterns 21a. FIG. 3B shows a mark pattern P212. The overall shape of the mark pattern P212 is an L shape (L shape placed upside down) constituted by the two small patterns 21a. FIG. 3C shows a mark pattern P213. The overall shape of the mark pattern P213 is a box shape constituted by the four small patterns (features) 21a. FIG. 3D shows a mark pattern P214. The mark pattern P214 has four groups of the plural small patterns (features) 21a. The mark pattern P214 is so arranged that the adjoining two groups of mark features are rotated relative to each other by 90 degrees.

According to the mold 110 in this embodiment, the channels 30 are provided in the direction from the first region A1 to the mark patterns P211, P212, P213, and P214. The shapes of the mark patterns P211, P212, P213, and P214 are only examples and may have other shapes.

Imprinting using the mold 110 is now explained.

FIGS. 4A through 4D are cross-sectional views schematically illustrating an example of the imprinting.

FIGS. 4A through 4D schematically show an example forming a pattern by using the mold 110 according to this embodiment.

Figure 4A:
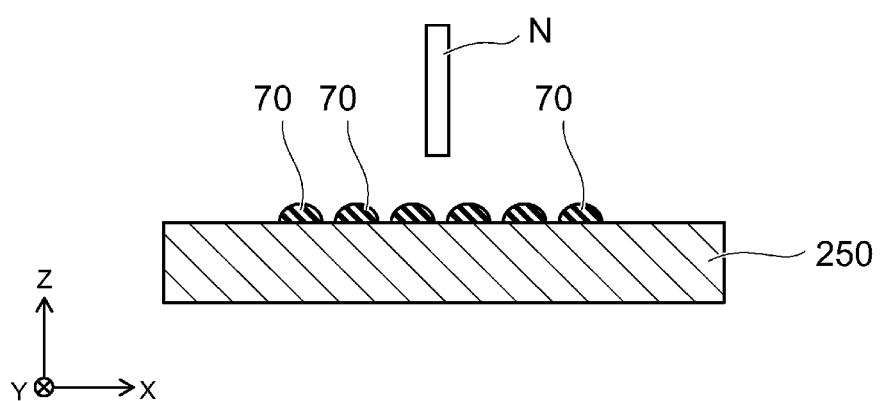
FIGS. 4A through 4D are cross-sectional views schematically illustrating an example of imprinting.

Initially, the resin 70, made of photo-sensitive organic material, is applied to a substrate 250 as illustrated in FIG. 4A. The resin 70 is applied to the substrate 250 from a nozzle N by ink jetting, for example. The resin 70 is applied not to the entire surface of the substrate 250 but only to an area of the substrate 250 corresponding to the first region A1 of the mold 110. The amount of a droplet (hereinafter referred to as a drop in some cases) of the resin 70 is in the range from about 0.5 picoliter (pl) to about 5 pl, for example. The radius of the expansion area of a droplet is in the range from about 50 µm to about 500 µm, for example. Each interval between droplets of the resin 70 is in the range from about 10 µm to about 500 µm, for example. The intervals of droplets are not required to be uniform.

Figure 4B:
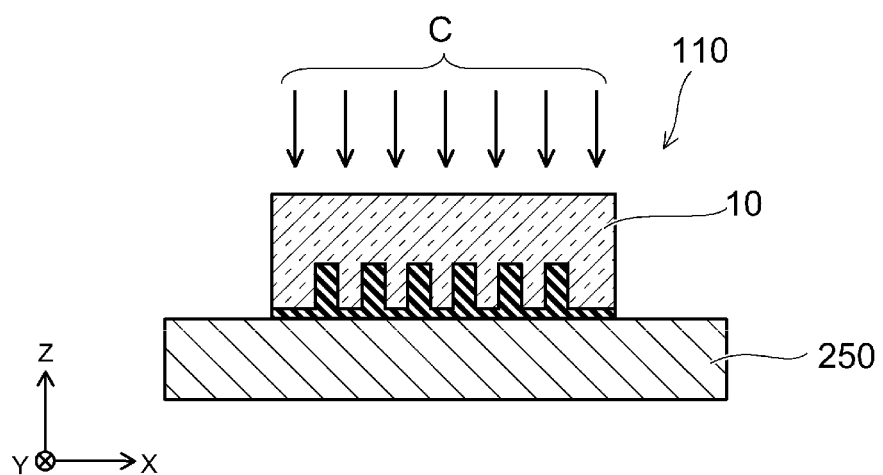

Then, as illustrated in FIG. 4B, the mold 110 according to this embodiment is prepared. The pattern area P of the mold 110 is brought into contact with the resin 70. The resin 70 is sandwiched between the mold 110 and the substrate 250 and expands from the applied position. At this time, the resin 70 flows from the first region pattern P1 into the second region pattern P2 via the channels 30. Obviously, the resin 70 may take other routes as well as the channels 30 for expansion. However, the resin 70 passing through the channels 30 can more rapidly and securely reach the second region A2. As a result, the resin 70 expands or flows to the second region A2 and fills the pattern P2. Accordingly, the resin 70 can securely fill the concave patterns within both the first region pattern P1 and the second region pattern P2.

Under the condition of contact between the pattern area P of the mold 110 and the resin 70, light C is applied from the second surface 10b side of the mold 110. The light C used herein is ultraviolet light, for example. The light C passes through the mold 110 and reaches the resin 70. The resin 70 is hardened by the light C applied thereto.

Figure 4C:
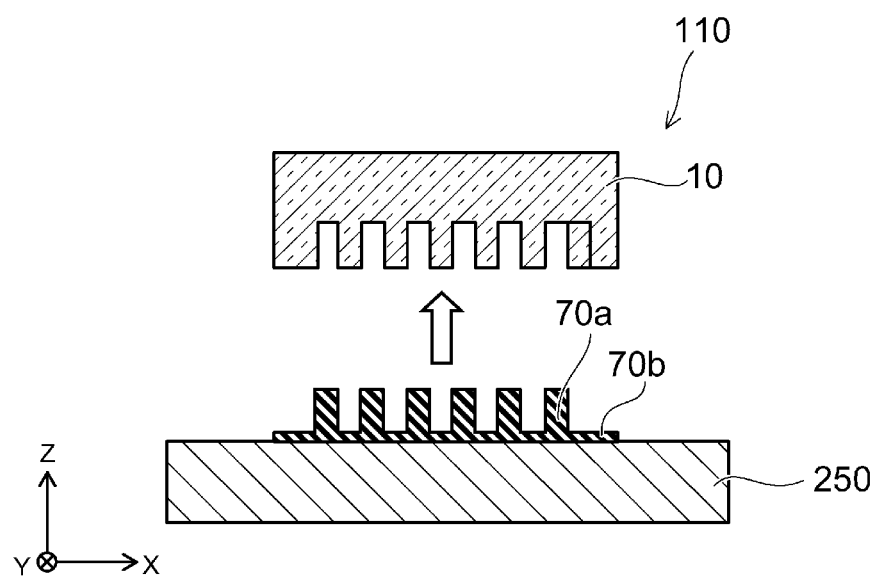

In the subsequently step, the mold 110 is separated from the resin 70 as illustrated in FIG. 4C. As a result, a transfer pattern 70a having a reverse pattern of the concavities and convexities of the mold is transferred from the pattern area P of the mold 110 and is formed in the resin 70 layer on the substrate 250. When the mold 110 is brought into contact with the resin 70, a slight clearance is produced between the mold 110 and the substrate 250. The resin 70 having entered this clearance remains as a remaining film 70b after hardening. The processes up to this step are called "imprinting".

Figure 4D:
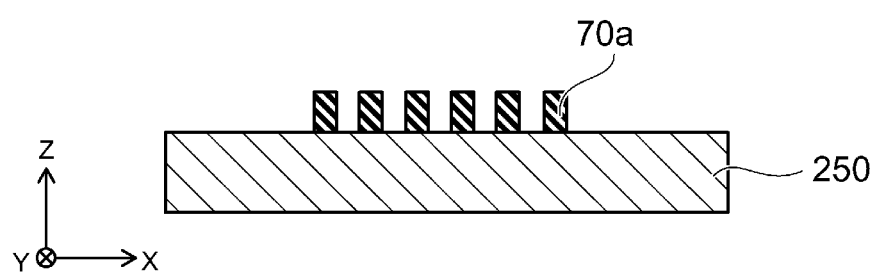

Then, removal of the remaining film 70b is carried out. For example, the transfer pattern 70a and the remaining film 70b are etched by RIE (reactive ion etching). As a result, only the transfer pattern 70a remains on the substrate 250 as illustrated in FIG. 4D.

Figure 5A:
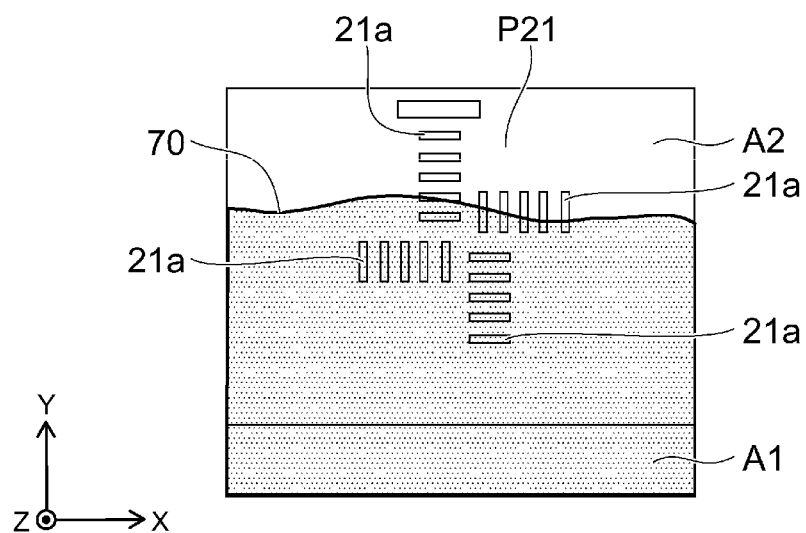
FIGS. 5A through 5C are plan views schematically illustrating an example of expansion of a resin.
Figure 5B:
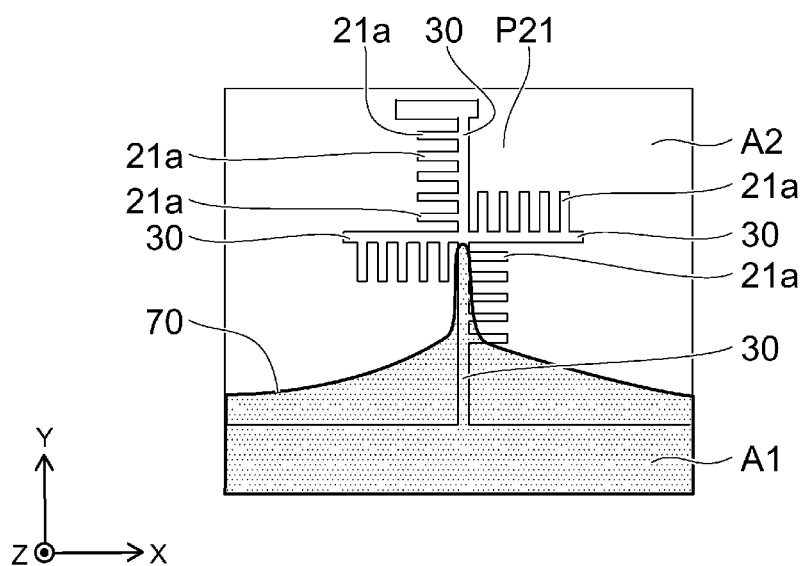
Figure 5C:
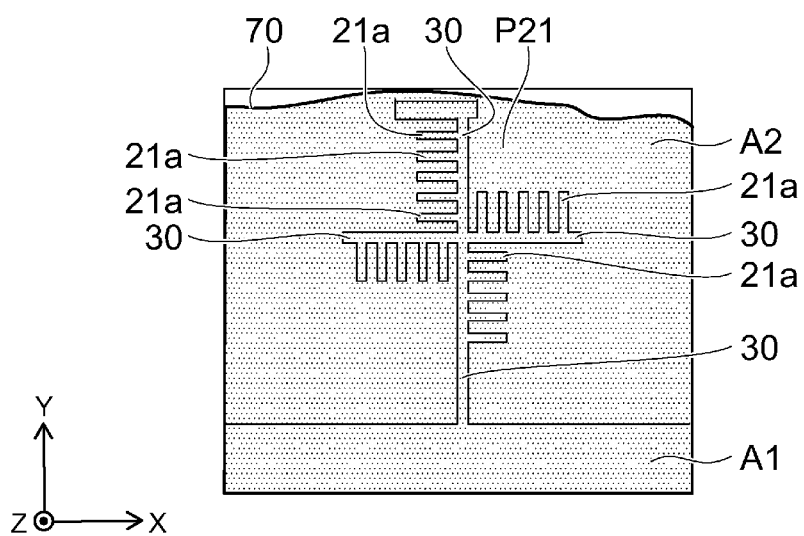

FIGS. 5A through 5C are plan views schematically illustrating expansion of the resin.

FIG. 5A is a plan view schematically illustrating an example of expansion of the resin 70 when the channel 30 is not provided. FIGS. 5B and 5C are plan views schematically illustrating an example of expansion of the resin 70 when the channel 30 is provided.

When the channel 30 is not provided as illustrated in FIG. 5A, such a condition may be produced in which the resin 70 expands from the drop position in the first region A1 toward the outside (perimeter) of the first region A1 but it only reaches a certain position before the end of the second region pattern P2 (such as mark pattern P21) of the second region A2. Moreover, the amount of the drops of the resin 70 may be reduced in a certain case so as to prevent overflow of the resin 70 from the second region A2 toward the outside. In this case, the resin 70 may not sufficiently expand toward the second region pattern P2.

When the channel 30 is provided as illustrated in FIGS. 5B and 5C, the resin 70 easily reaches the second region A2 via the channel 30 at the time of expansion from the drop position in the first region A1 toward the outside. FIG. 5B shows the condition of the resin 70 expanding toward the second region A2 via the channel 30. FIG. 5C shows the condition of the resin 70 having reached the entire area of the second region pattern P2 of the second region A2.

According to the structure of the mold 110 in this embodiment, the expansion of the resin 70 is controlled by setting appropriate width, length, position, direction, depth, and other conditions of the channel 30. For example, the speed of expansion (flow speed) of the resin 70 within the channel 30 is set higher than the speed of expansion (flow speed) of the resin 70 within the second region pattern P2. In this case, even the resin 70 in an amount so decreased as to prevent overflow can securely expand to the second region A2 from the first region A1. Accordingly, the resin 70 can accurately fill the second region pattern P2.

Figure 14:
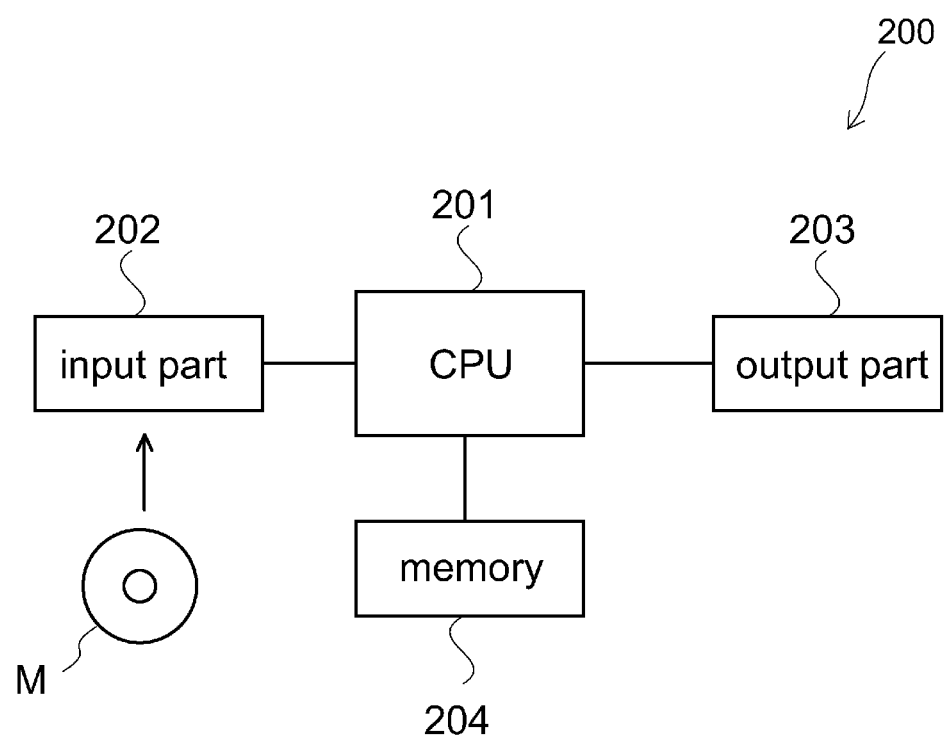
FIG. 14 illustrates an example of a hardware structure of a computer.

A mold layout determination method according to this embodiment, which is used in conjunction with a computer as described with respect to FIG. 14 herein, is now explained.

FIG. 6 is a flowchart showing an example of the mold manufacturing method according to the first embodiment.

As illustrated in FIG. 6, the pattern layout method in this embodiment includes a design pattern data input step (step S101), a target pattern size input step (step S102), a connection target pattern extraction step (step S103), a channel pattern size input step (step S104), a target pattern connection channel calculation step (step S105), and a mold data output step (step S106).

Initially, design data of the patterns to be formed in the substrate is input as the design pattern data input shown in step S101. The design data includes design data of the first patterns and of the second patterns. The first patterns correspond to patterns formed by the first region pattern P1 (such as circuit interconnect or implant region patterns). The second patterns correspond to patterns formed by the second region pattern P2 (such as alignment marks).

In the target pattern size input step shown in step S102, data of the first patterns and data of the second patterns is input. For example, the positions, widths, lengths, and pitches of the patterns are input.

In the connection target pattern extraction step shown in step S103, the second patterns requiring connection to the first by the channels 30 are extracted. The process in step S103 extracts the first patterns, and the second patterns which may be left unfilled with the resin 70 due to separation from the first patterns based on the data inputted in steps S101 and S102.

In the channel pattern size input step shown in step S104, the size of the patterns forming the channels 30 (third pattern in this embodiment) is input. The size of the third patterns includes data on each shape, width, and depth of the cross sections of the third patterns, and each cross-sectional area of the third patterns, for example.

In the channel calculation step shown in S105, the third patterns connecting the previously extracted first patterns and the second patterns are calculated. The third patterns are determined based on the data on the feature values or properties of the resin 70. The feature values are factors for determining the expansion of droplets. These factors include the density of the resin 70, the proportion of the covered areas of the concave patterns, the depth of the concave patterns, the capacity of the concave patterns, the size of the drop, the volume of the drop, the amount of volatilization of the material constituting the resin 70, the surface tension, the viscosity, the surface roughness of the channel 30, and other conditions.

In the data output step shown in S106, the data of the first pattern, the second pattern, and the third pattern is output. The pattern area P is formed on the pedestal 20 of the base 10 based on the outputted data, whereupon the mold 110 is finally completed.

Figure 7A:
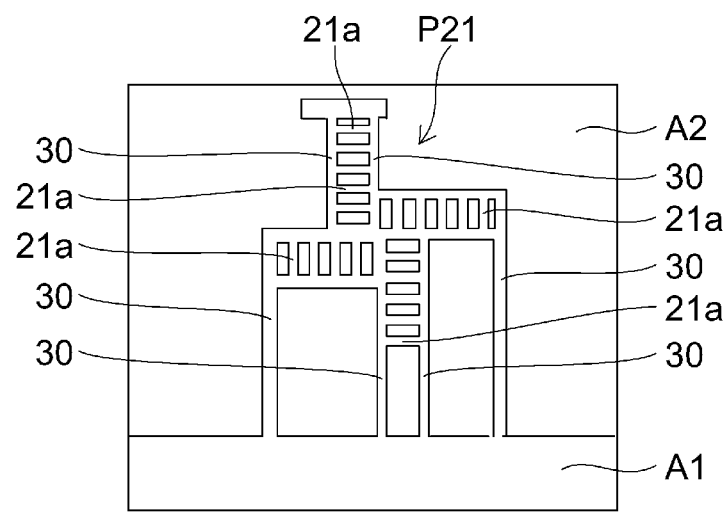
FIGS. 7A through 7C are plan views schematically illustrating examples of other patterns of the mold.
Figure 7B:
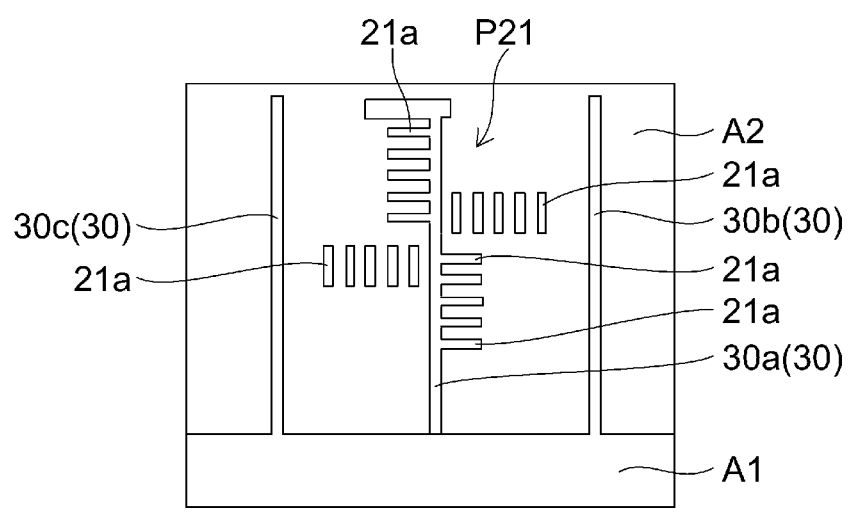
Figure 7C:
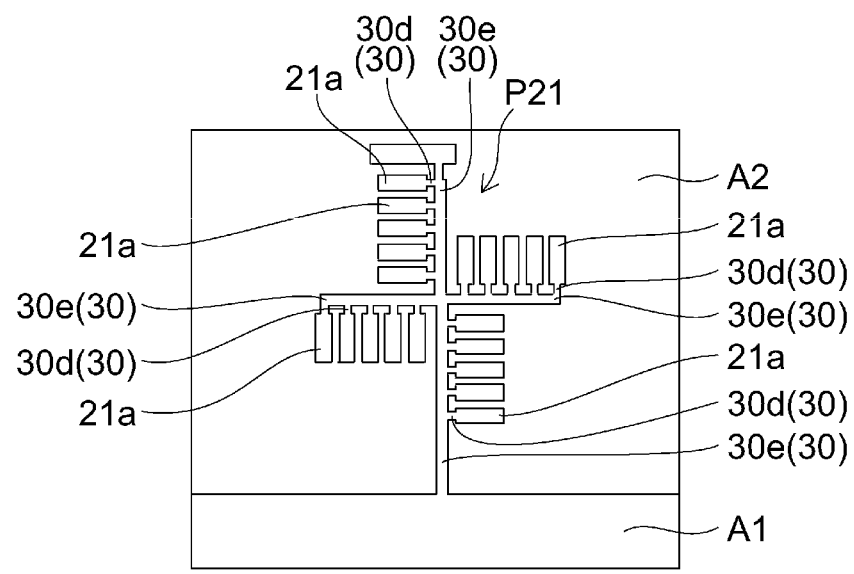

FIGS. 7A through 7C are plan views schematically illustrating examples of other patterns of the mold.

According to a pattern shown in FIG. 7A, the channel(s) 30 is so formed as to surround the peripheries of the small features of the patterns 21a. The resin 70 flowing from the first area A1 passes through the channel 30 and flows into the second region A2 when the pattern area P of the mold 110 is imprinted onto the resin 70. The resin 70 having entered the second region A2 fills the second region pattern P2 (such as the plural small features of the patterns 21a of the mark pattern P21).

According to a pattern shown in FIG. 7B, plural channels 30 (such as channels 30a, 30b, and 30c) extend from the first region pattern P1 to the second region pattern P2.

The channel 30a connects with the small feature patterns 21a. The channel 30a extends from the first region pattern P1 to the second region pattern P2. The channels 30b and 30c do not connect with the small feature patterns 21a but only extend generally linearly from the first area A1.

In the case of imprinting by using the mold 110 in this form, the resin 70 expands from the first region A1 toward the second region A2 via the channels 30a, 30b, and 30c. In this case, the resin 70 passing through the channel 30a flows into the small patterns 21a connected with the channel 30a. The resin 70 overflowing from the first region A1 and the resin 70 overflowing from the channel 30a also fill the isolated small features of the patterns 21a.

The channels 30b and 30c isolated in the second region A2 have the function of promoting expansion (flow) of the resin 70 outwardly from the first region A1. The resin 70 overflowing from the first region A1 passes through the channels 30b and 30c and securely expands to the end of the second region A2. Thus, the resin 70 can easily fill the isolated small patterns 21a. The channels 30b and 30c also have the function of absorbing surplus resin 70 to prevent overflow thereof toward the outside of the second region A2.

According to a pattern shown in FIG. 7C, channels 30d and 30e having different widths are provided. The width of the channel 30e is 1 μm, for example. The width of the channel 30d is smaller than the width of the channel 30e, such as 0.1 μm. The depth of the channel 30e is in the range from about 10 nm to about 200 nm (such as about 100 nm), for example. The depth of the channel 30d is in the range from about 10 nm to about 200 nm (such as about 100 nm), for example. The channel 30d is provided between the small features of the patterns 21a and the channel 30e.

In the case of imprinting using the mold 110 in this form, the resin 70 expands from the first region A1 to the second region A2 via the channels 30d and 30e. In this case, the resin 70 flows from the first region A1 into the second region A2 through the channel 30e, and reaches the small feature patterns 21a through the channel 30d. The width of the channel 30d is smaller than the width of the channel 30e. Thus, the resin 70 securely flows into the small patterns 21a after passing through the channel 30e and then through the channel 30d.

According to the mold 110 in this embodiment, the channels 30 extending from the first region A1 to the second region A2 are provided to control the expansion of the resin 70. When imprinting is performed using the mold 110 thus constructed, the resin 70 accurately reaches the ends of the patterns formed in the second region A2, and fills the patterns without surpluses and shortages.

Second Embodiment

A mold pattern design method according to a second embodiment for spreading the resin to a peripheral pattern, such as the features of an alignment mark pattern, is hereinafter described.

The mold pattern design method according to the second embodiment is a method which provides the linking channels 30 based on the drop position of the resin 70 dropped on the substrate 250.

Figure 8:
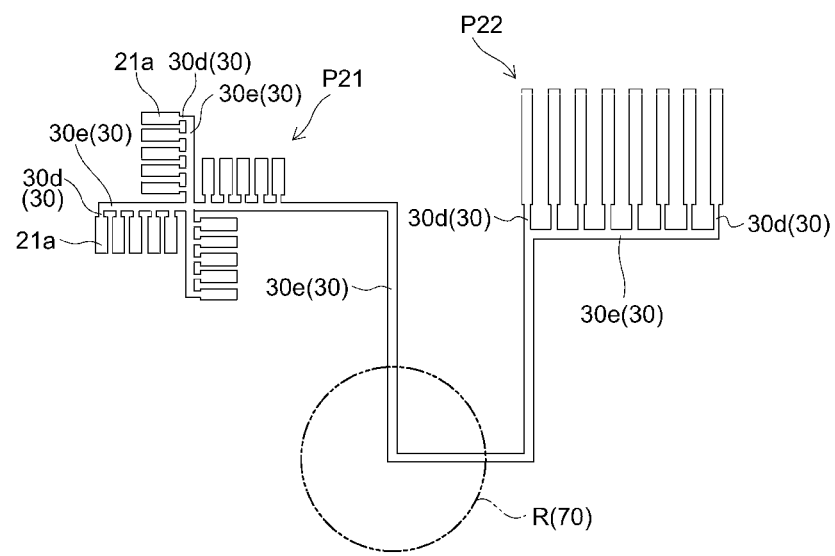
FIG. 8 is a plan view schematically illustrating an example of a mold manufacturing method according to a second embodiment.

FIG. 8 is a plan view schematically illustrating the mold manufacturing method according to the second embodiment.

FIG. 8 schematically shows the relationship between the channels 30 formed in the mold and the drop position of the resin 70.

The alternate long and two short dashed line in FIG. 8 indicates a region R of the front surface 20a of the pedestal 20 corresponding to the drop area of the resin 70. The method according to this embodiment forms the channels 30 extending from the region R toward the mark pattern P21 and another pattern P22, for example. The channels 30 may include the channel 30e and the channels 30d.

As illustrated in FIG. 4A, the resin 70 falls on a predetermined position (X, Y coordinates) on the substrate 250. The drop information of the resin 70 involves the size and volume of the droplets, for example.

According to the mold manufacturing method in the second embodiment, the channels 30 are determined based on the information of the resin 70 to be dropped. In designing the channels 30, the feature values discussed above are used. The factors to be considered in designing include the route of the channels, the entire length of the channels, the width of the channels, and the depth of the channels.

Figure 9:
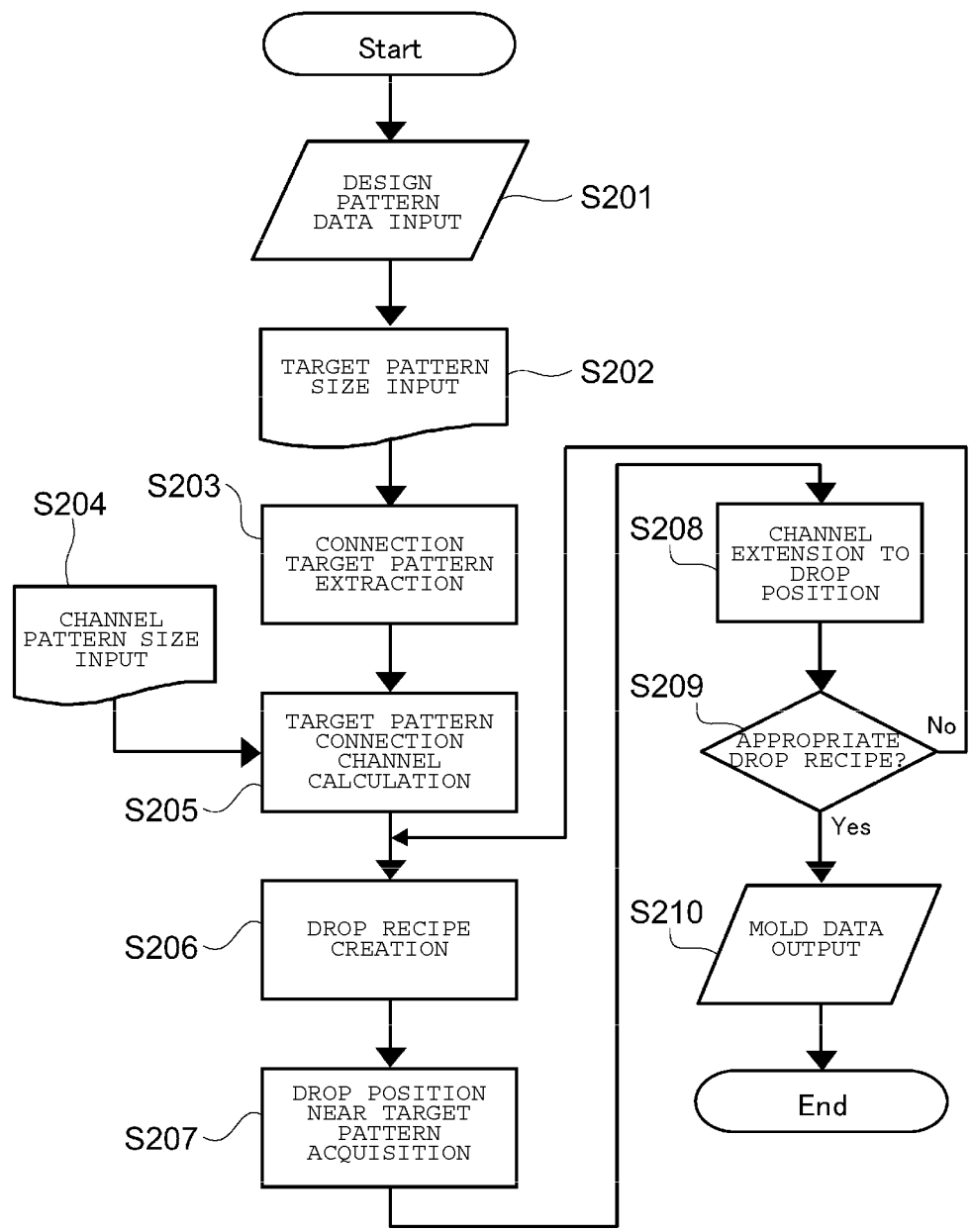
FIG. 9 is a flowchart showing the example of the mold manufacturing method according to the second embodiment.

FIG. 9 is a flowchart showing an example of the mold design method according to the second embodiment.

As shown in FIG. 9, the pattern forming method according to this embodiment includes design pattern data input (step S201), target pattern size input (step S202), connection target pattern extraction (step S203), channel pattern size input (step S204), target pattern connection channel calculation (step S205), drop recipe creation (step S206), drop position near target pattern acquisition (step S207), channel extension to drop position (step S208), appropriate drop recipe determination (step S209), and data output (step S210).

Initially, design data of patterns to be formed in the substrate is input in the design pattern data input step shown in step S201. The design data includes design data of first patterns. The first patterns are patterns to be formed in the substrate 250. According to the second embodiment, the first patterns correspond to patterns formed by the first region pattern P1 (such as circuit patterns), and patterns formed by the second region pattern P2 (such as alignment marks).

In the target pattern size input step shown in step S202, data of the first patterns is input. For example, the positions, widths, lengths, and pitches of the patterns are input.

In the connection target pattern extraction shown in step S203, the first patterns requiring connection by the channels 30 are extracted. The process in step S203 extracts the first patterns which may be left unfilled with the resin 70 based on the data input in steps S201 and S202.

In the channel pattern size input in step S204, the size of the patterns forming the channels 30 (second pattern in this embodiment) is input. The size of the second patterns includes data on each shape, width, and depth of the cross sections of the second patterns, and each cross-sectional area of the second patterns, for example.

In the channel calculation step shown in step S205, the second patterns connecting with the previously extracted first patterns are calculated. The second patterns are determined based on the data on the feature value of the resin 70.

In the drop recipe creation step shown in step S206, the information concerning dropping of the resin 70 (drop recipe) is created. The drop recipe includes the amount and position of the dropping of the resin 70. The drop recipe determines information about the approximate amount of dropping, the location of dropping on the substrate 250, the layout of the dropping position, and other conditions based on the surface tension, the viscosity and the like of the material forming the resin 70.

In the drop position acquisition step shown in step S207, the coordinates of the drop position are obtained from the drop recipe (S206) previously created.

In the extension of the channels to the drop position step shown in step S208, the channels 30 are extended from the drop position obtained in step S207 to the first patterns extracted in step S203. The design of the channels 30 is determined based on the data of the feature values of the resin 70.

In the subsequent step S209, the drop recipe is verified to determine whether the drop recipe is appropriate or not. The verification of the drop recipe is performed by simulation, for example. More specifically, it is verified whether the resin 70 dropped in accordance with the drop recipe passes through the channels 30 and securely fills the first patterns. When it is determined that the resin 70 accurately fills the first patterns in this step, the flow proceeds to step S210. In the data output shown in step S210, the data of the first patterns and the data of the second patterns are outputted.

When it is determined that the resin 70 does not accurately fill the first patterns in the verification of the drop recipe in step S209, the design flow returns to step S206. After returning to step S206, a new drop recipe is created. Then, the processes from step S207 to step S209 are again performed based on the newly created drop recipe. These steps are repeated until the condition of the first patterns accurately filled with the resin 70 can be confirmed. Then, the data of the first patterns and the data of the second patterns are outputted in step S210.

According to the mold design method in this embodiment, the channels 30 are determined based on the relationship between the drop position of the resin 70 and the first patterns. Accordingly, the expansion of the resin 70 is controlled considering the drop position of the resin 70. For example, even in the case of a structure which fixes the drop position of the resin 70, the resin 70 can securely fill the first patterns by determining the channels 30 in accordance with the drop position of the resin 70.

Third Embodiment

A mold according to a third embodiment is now explained.

Figure 10A:
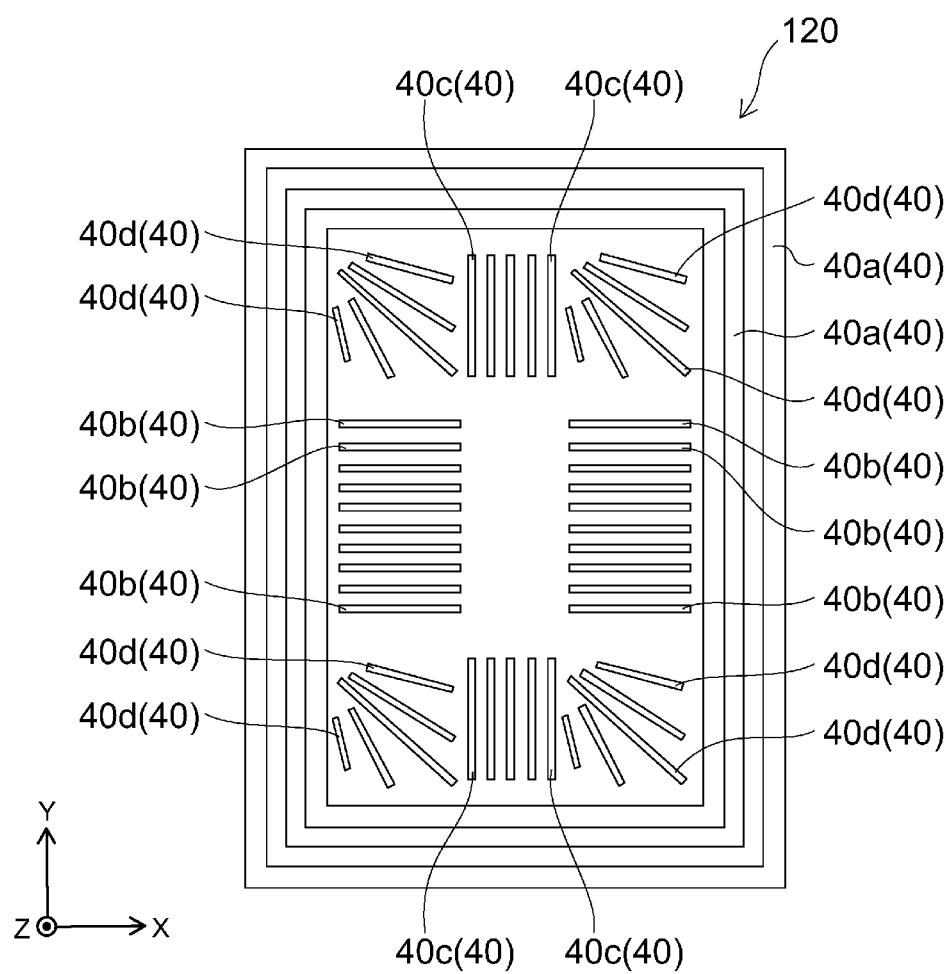
FIGS. 10A and 10B are plan views schematically illustrating an example of a mold according to a third embodiment.
Figure 10B:
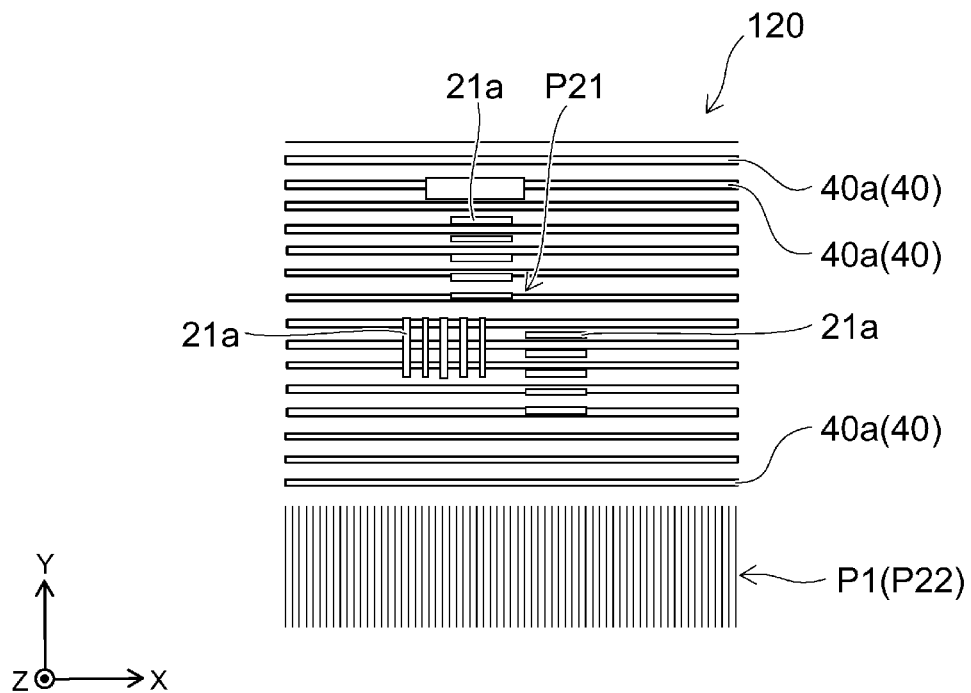

FIGS. 10A and 10B are plan views schematically illustrating a mold according to the third embodiment.

Figure 11A:
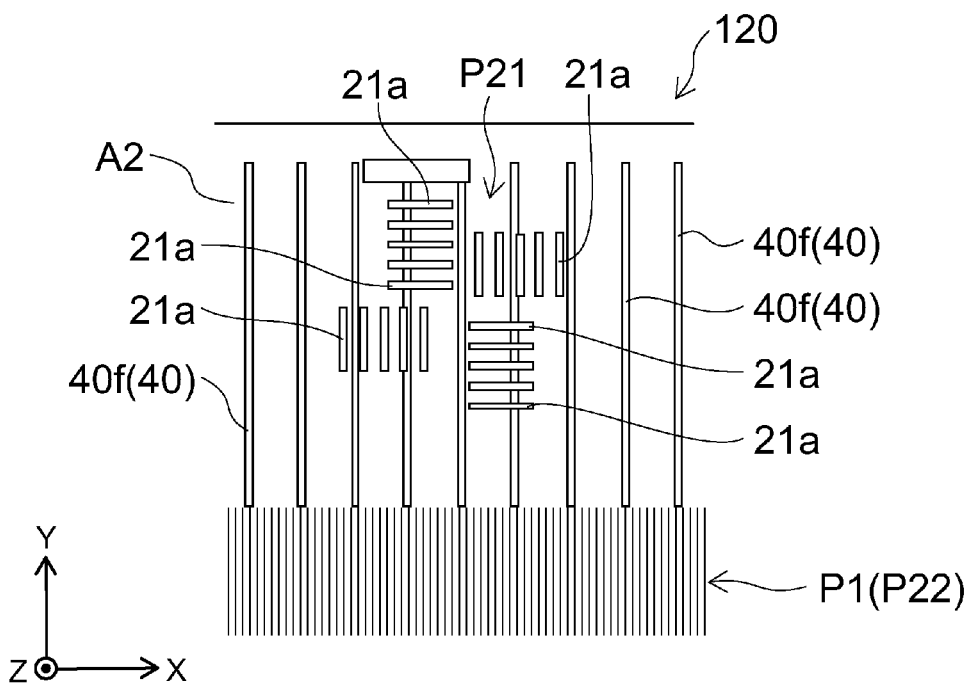
FIGS. 11A through 11C are plan views schematically illustrating other examples of channels.
Figure 11B:
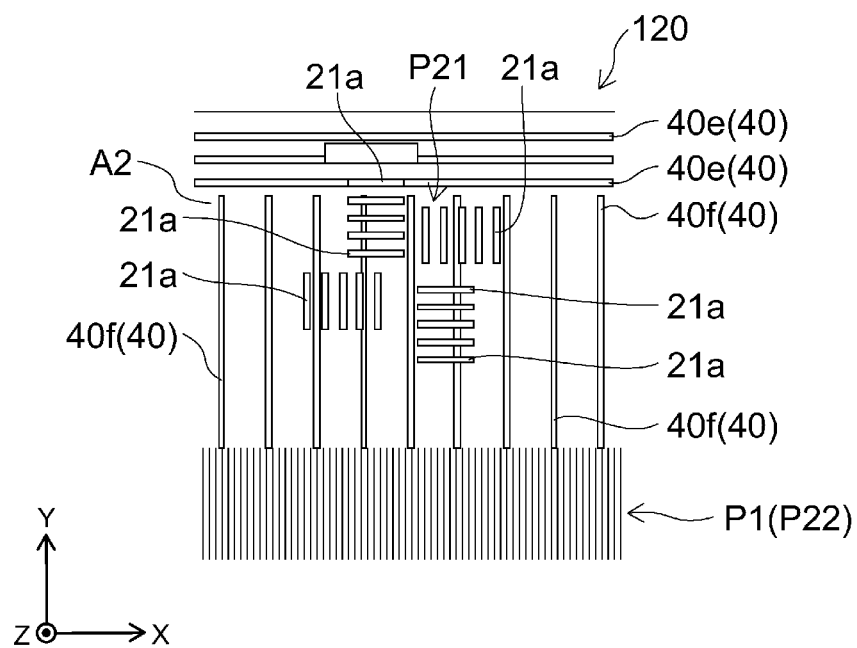
Figure 11C:
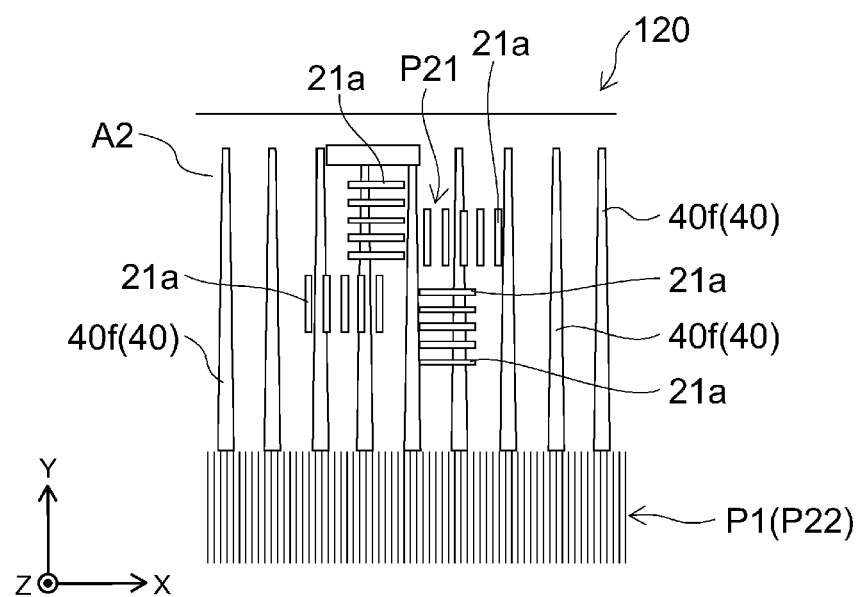

FIGS. 11A through 11C are plan views schematically illustrating other examples of the channels.

FIG. 10A is a plan view schematically illustrating the enlarged pedestal 20. FIG. 10B is a plan view schematically illustrating the enlarged second region A2. FIGS. 11A through 11C are plan views schematically illustrating the enlarged second region A2. Channels 40a through 40g discussed herein as examples are collectively referred to as channels 40.

As illustrated in FIGS. 10A and 10B, a mold 120 according to the third embodiment includes a first concave pattern and a second concave pattern provided in the pedestal 20. The mold 120 contains the mark pattern P21, an other pattern P22, and the channels 40, for example. The mark pattern P21 and the other pattern P22 of the mold 120 correspond to the first concave pattern. The channels 40 of the mold 120 correspond to the second concave pattern.

The features of the first concave pattern have a first depth. The channel 40 features of the second concave pattern have a second depth smaller than the first depth. As illustrated in FIG. 10A, the channels 40 extend in a wide range of directions along the front surface 20a of the pedestal 20. The channels 40 shown in FIG. 10A as an example, have various sizes, shapes, and directions (channels 40a through 40e). The four types of the channels 40a through 40e may be arbitrarily provided as long as at least one type of the channels 40a through 40e is formed. For example, the channels 40a are formed in such positions as to surround the outside of the first region pattern P1 (FIG. 10B). Each width of the channels 40a is in the range from about 0.01 µm to about 100 µm (such as about 0.1 µm), for example. Each depth of the channels 40a is about 10 nm, for example.

The channels 40b extend in the X direction within the first region A1. According to this structure, the plural channels 40b are provided. The plural channels 40b are disposed in parallel with one another in the Y direction with a predetermined pitch. The channels 40c extend in the Y direction within the first region A1. According to this structure, the plural channels 40c are provided. The plural channels 40c are disposed in parallel with one another in the X direction with a predetermined pitch. Each width of the channels 40b and 40c is in the range from about 0.01 µm to about 100 µm (such as about 0.1 µm), for example. Each depth of the channels 40b and 40c is about 10 nm, for example.

The channels 40d extend in such directions as not to be in parallel with the X direction and the Y direction within the first region A1. Each width of the channels 40d is in the range from about 0.01 µm to about 100 µm (such as about 0.1 µm), for example. Each depth of the channels 40d is about 10 nm, for example.

The channels 40 may radially extend from the center of the first region A1 toward the outer periphery of region A1.

As illustrated in FIG. 10B, channels 40a are formed in the second region A2, i.e., on the periphery of the mold substrate 120. A plurality of channels 40a are provided, for example. The plural channels 40a extend in parallel with each other at a predetermined pitch (spacing). The plural channels 40a are disposed in such a condition as to overlap with the features of the mark pattern P21 corresponding to the second region pattern P21, for example.

FIGS. 11A through 11C are plan views schematically illustrating examples of other channel layouts.

FIGS. 11A through 11C are plan views schematically illustrating an enlarged second region pattern P21. As illustrated in FIG. 11A, channels 40f extend in the Y direction within the second region A2, for example. According to this structure, the plural channels 40f are provided. The plural channels 40f extend in parallel with each other in the X direction with a predetermined pitch. The plural channels 40f are disposed so as to overlap with the mark pattern P21 corresponding to the second concave pattern, for example. The width of the channels 40f is in the range from about 0.01 µm to about 100 µm (such as about 0.1 µm), for example. The depth of channels 40e is about 10 nm, for example.

FIG. 11B illustrates an example mold having channels 40e and channels 40f. The plural channels 40f are formed on the mark pattern P21 within the second region A2, while the plural channels 40e extend in the X direction beyond the position of the channels 40f.

FIG. 11C illustrates channels 40g. The width of the channels 40g is not uniform. In other words, the channel 40g width may vary in the extending direction. For example, the width of the channels 40g may gradually decrease in the direction from the first region A1 to the second region A2 as illustrated in FIG. 11C. On the contrary, the width of the channels 40g may gradually increase in the same direction.

The depth of the channels 40 may vary in the extending direction. For example, the depth of the channels 40 may gradually decrease or increase in the direction from the first region A1 to the second region A2.

The mold 120 includes at least one type of the channels 40a through 40g discussed above as examples. In the case of imprinting using the mold 120 thus constructed, the resin 70 fills the first concave patterns, and expands while passing through the second concave patterns (channels 40) shallower than the first concave patterns. The second concave patterns thus provided can control the fluidity of the resin 70 during imprinting. This structure allows the resin 70 to accurately fill the first concave patterns.

A method for manufacturing the mold 120 is now explained.

FIGS. 12A through 12D are cross-sectional views schematically illustrating an example of the mold manufacturing method.

Figure 12A:
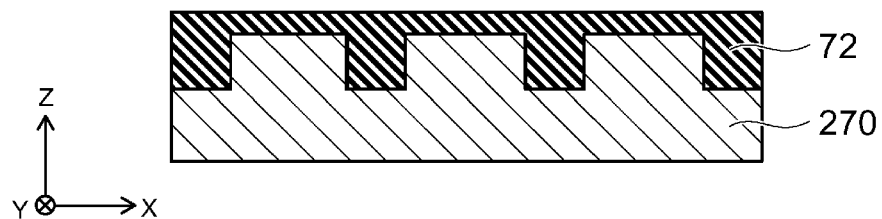
FIGS. 12A through 12D are cross-sectional views schematically illustrating an example of a mold manufacturing method.

Initially, a resin 72 made of photosensitive organic material is applied to a mold 270 provided with normal concave patterns as illustrated in FIG. 12A. The resin 72 is applied to the mold 270 by spin-coating, for example.

Figure 12B:
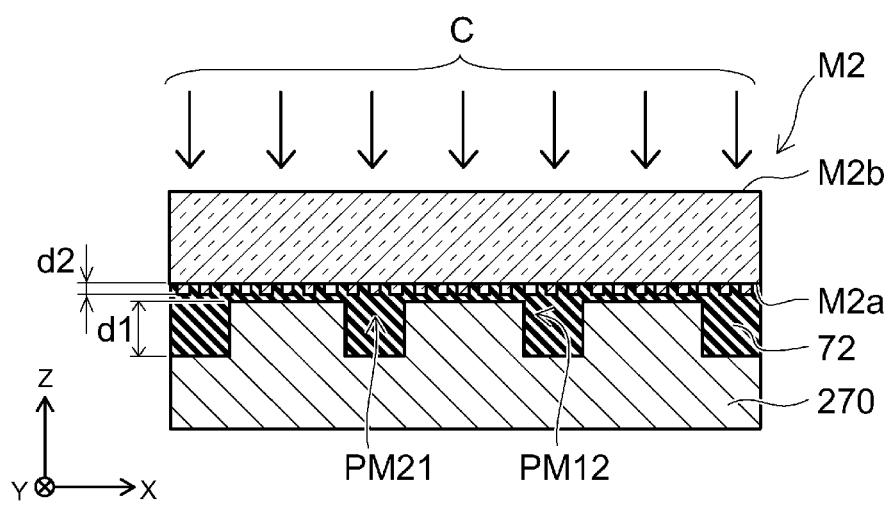

Then, an original mold M2 is prepared having the features shown in FIG. 12B. The original mold M2 has a concave and convex pattern PM21 in a main surface M2a. The original mold M2 is made of quartz, for example. Each width of the concavities is about 10 nm, for example. Each depth of the concavities is about 10 nm. Each width of the convexities is about 10 nm. Each depth of the concavities of the concave and convex pattern PM21 formed on the mold M2 is smaller than a depth d2 of each concavity of a concave and convex pattern PM12 of the mold 270.

The original mold M2 is brought into contact with the resin 72. Light C is applied from the side of a second surface M2b of the original mold M2 positioned on the side opposite to the first surface M2a during contact between the original mold M2 and the resin 72. The light C used herein is ultraviolet light, for example. The light C passes through the second original mold M2 and reaches the resin 72. The resin 72 is hardened (cured) by the light C applied thereto.

Figure 12C:
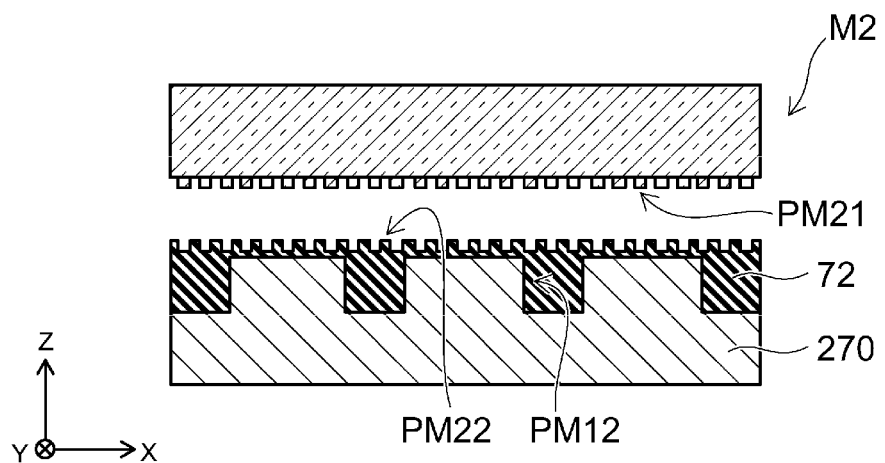

Then, the original mold M2 is separated from the resin 72 as illustrated in FIG. 12C. As a result, a concave and convex pattern PM22 is formed on the surface of the resin 72 as a pattern having the reversed shape of the concave and convex pattern PM21 of the second original mold M2.

Figure 12D:
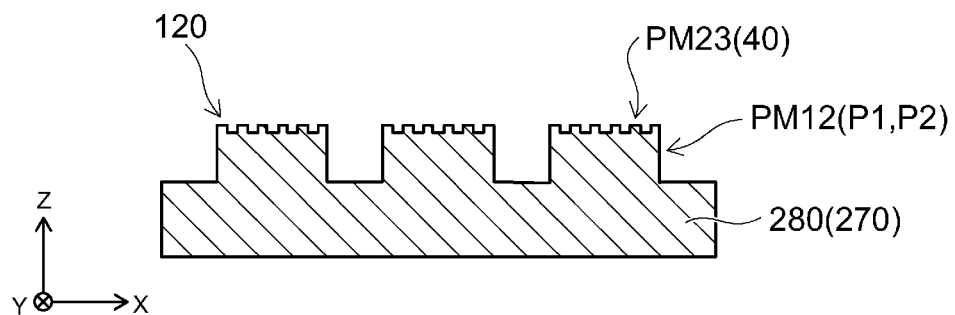

Then, the mold 270 is etched to transfer the concave and convex pattern PM22 thereto. The mold 270 having the patterned resin thereon is etched by RIE, for example. As a result, a concave and convex pattern PM23 having the shape of the concave and convex pattern PM22 imprinted by the original mold M2 to the surfaces of the convexities of the mold 270 is formed as illustrated in FIG. 12D. A mold 280 having the concave and convex pattern PM23 becomes the mold 120. The concave pattern of the concave and convex pattern PM21 corresponds to the first region pattern P1 and the second region pattern P2. The concave pattern of the concave and convex pattern PM23 correspond to the channels 40.

The pattern forming method using the mold 120 is now explained.

FIGS. 13A through 13D are cross-sectional view schematically illustrating an example of the pattern forming method.

Figure 13A:
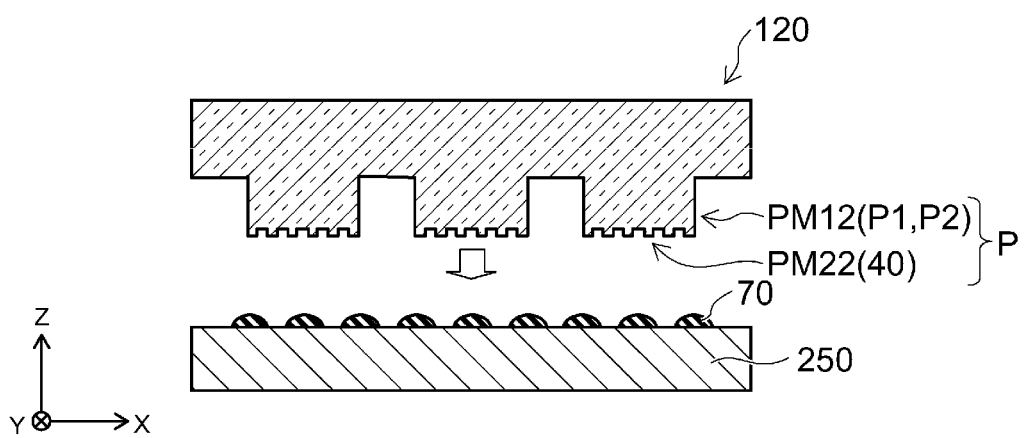
FIGS. 13A through 13D are cross-sectional views schematically illustrating an example of a pattern forming method.

Initially, the mold 120 is prepared as illustrated in FIG. 13A. The mold 120 is manufactured by the method shown in FIGS. 12A through 12D, for example.

Then, a photosensitive resin 70 made of photosensitive organic material is applied to the substrate 250. The resin 70 is applied to the substrate 250 by ink jetting or ink dropping, for example. The liquid amount of a droplet of the resin 70 is in the range from about 0.5 pl to about 5 pl, for example. The radius of the expansion area of a droplet is in the range from about 50 µm to about 500 µm, for example. Each interval of droplets of the resin 70 is in the range from about 10 µm to about 500 µm, for example. The intervals of droplets are not required to be uniform.

Figure 13B:
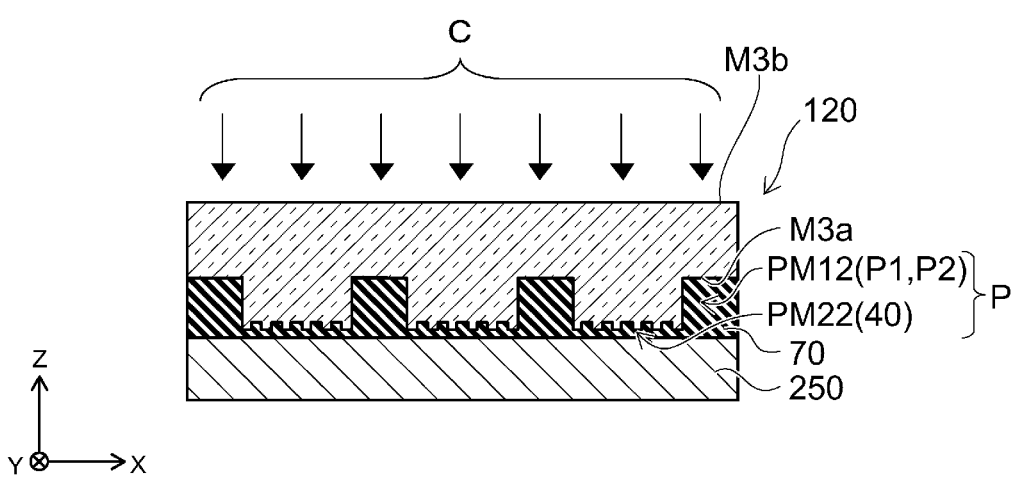

Then, the pattern area P of the mold 120 is brought into contact with the resin 70 as illustrated in FIG. 13B. The resin 70 flows from the first region pattern P1 through the channels 40, and fills the first region pattern P1 and the second region pattern P2.

In the condition of contact between the pattern area P of the mold 120 and the resin 70, the light C is applied from the side of a second surface M3b of the mold 120 disposed on the side opposite to a first surface M3a where the pattern area P is formed. The light C used herein is ultraviolet light, for example. The light C passes through the base 10 and the pattern area P and reaches the resin 70. The resin 70 is hardened by the light C applied thereto.

Figure 13C:
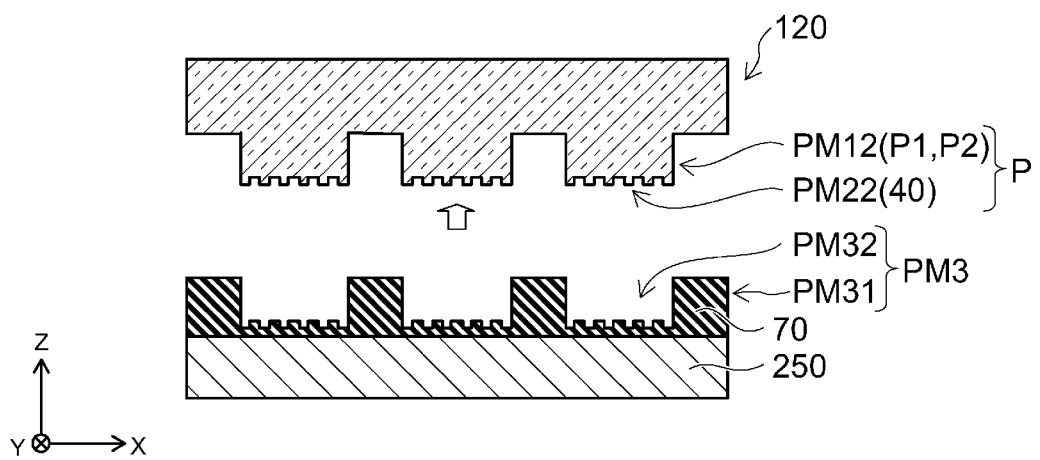

Then, the mold 120 is separated from the resin 70 as illustrated in FIG. 13C. As a result, a pattern PM3 having a concave and convex shape transferred from the pattern area P of the mold 120 is formed in the substrate 250. The pattern PM3 includes a concave and convex pattern PM31 having a shape transferred from the first region pattern P1 and the second region pattern P2 of the mold 120, and a concave and convex pattern PM32 having a shape transferred from the channels 40 of the mold 120.

Figure 13D:
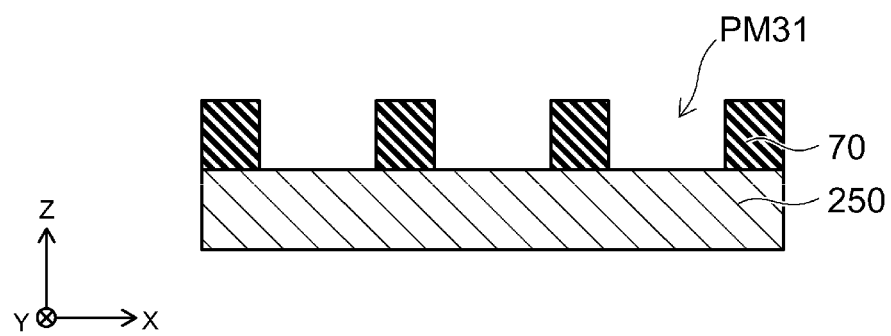

Subsequently, the substrate 250 is etched while masked with the pattern PM3. The substrate 250 is etched by RIE, for example. As a result, the concave and convex pattern PM32 is removed by etching, and only an area corresponding to the portion of the concave and convex pattern PM31 remains in the substrate 250 as illustrated in FIG. 13D. The concave and convex pattern PM31 may be determined as a pattern desired to be produced. Alternatively, the substrate 250 may be etched using the concave and convex pattern PM31 as a mask to produce a desired pattern in the substrate 250.

Fourth Embodiment

The channel design method included in the mold design method described above can be practiced in the form of a program (channel design program) performed by a computer.

FIG. 14 shows an example of a hardware structure of a computer.

A computer 200 includes a central processing unit 201, an input part 202, an output part 203, and a memory 204. The input part 202 includes the function of reading information stored in a recording medium M. The channel design program is performed by the central processing unit 201.

Fifth Embodiment

The channel design program may be recorded in a recording medium readable by a computer. The recording medium M stores the design pattern data input (step S101), the target pattern size input (step S102), the connection target pattern extraction (step S103), the channel pattern size input (step S104), the target pattern connection channel calculation (step S105), and the mold data output (step S106) shown in FIG. 6 in a form readable by the computer 200.

Moreover, the recording medium M stores the design pattern data input (step S201), the target pattern size input (step S202), the connection target pattern extraction (step S203), the channel pattern size input (step S204), the target pattern connection channel calculation (step S205), the drop recipe creation (step S206), the drop position near target pattern acquisition (step S207), the channel extension to drop position (step S208), the appropriate drop recipe determination (step S209), and the data output (step S210) shown in FIG. 9 in a form readable by the computer 200. The recording medium M may be a recording device such as a server connected with a network.

Accordingly, the mold and the mold manufacturing method in this embodiment can control expansion of resin and perform highly reliable transfer.

While the embodiments and the modified examples of the embodiments have been described herein, the present disclosure is not limited to these specific examples. For example, the shapes of the channels 30 and 40 are not limited to oblong shapes as viewed in the Z direction. Moreover, the respective embodiments and the modified examples to which constituent elements are added, from which constituent elements are eliminated, or to which design changes are made by those skilled in the art, and any combinations of the characteristics of the respective embodiments, are included in the scope of the present disclosure as long as the spirit of the present disclosure is included therein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mold for imprinting, the mold comprising:
   a base comprising a first surface and a pedestal, the pedestal comprising a front surface projecting from the first surface, and the front surface comprising a first region and a second region disposed outward of the first region along a periphery of the pedestal;
   a molding pattern formed in the first region and having a first depth extending inwardly of the front surface;
   a set of distinct negative mark patterns formed in the second region and having a second depth extending inwardly of the front surface, each of the mark patterns comprising a plurality of pattern features; and
   a set of channels formed in the second region and having a third depth extending inwardly of the front surface, each of the channels connecting the molding pattern to a respective one of the mark patterns, wherein the entirety and all end portions of each of the mark patterns and each of the channels are positioned inwardly of the periphery of the pedestal and are disposed inwardly from the front surface, and wherein the channels and mark patterns prevent resin imprinted by the molding pattern during use of the mold from overflowing by allowing the resin to fill the mark patterns by passing through the channels.

2. The mold of claim 1, wherein:
   the molding pattern includes features having the first depth and a first width, the first depth and width together defining a cross-sectional area of the features of the molding pattern;
   the mark pattern features have the second depth and a second width, the second depth and width together defining a first cross-sectional area of the features of the mark pattern; and
   the channels have the third depth and a third width, the third depth and width together defining a second cross-sectional area smaller than the cross-sectional area of the features of the molding pattern and the first cross-sectional area of the mark pattern features.

3. The mold of claim 1, wherein a width of each of the channels is greater than widths of pattern features of the molding pattern or the mark pattern.

4. The mold of claim 1, wherein the mark pattern features each comprise a channel extending perpendicular to a respective one of the channels connecting that respective mark pattern to the molding pattern.

5. The mold of claim 4, wherein the perpendicular channels each have a length that is less than a length of the respective channel connecting that respective mark pattern to the molding pattern.

6. The mold of claim 1, wherein the molding pattern is an interconnect pattern.

7. The mold of claim 1, wherein the mark patterns also function as alignment marks or overlay metrology marks.

8. The mold of claim 1, further comprising a set of additional channels, each of the additional channels connecting to and extending outwardly from the molding pattern and into the second region between two of the mark patterns.

9. The mold of claim 1, wherein the second region is a peripheral region adjacent to the first region, the second region surrounding the first region.

10. The mold of claim 1, wherein pattern features of the molding pattern have a first width, the mark pattern features have a second width, and each of the channels have a third width which is greater than the first width.

11. The mold of claim 1, wherein the mark pattern features include a plurality of channels extending from a respective one of the channels connecting that respective mark pattern to the molding pattern, each of the mark pattern channels having a length that is less than a length of the channels connecting to the molding pattern.

12. The mold of claim 1, wherein the first depth is in a range from about 10 nm to 200 nm.

13. The mold of claim 12, wherein the second depth is in a range from about 10 nm to about 200 nm.

14. The mold of claim 13, wherein the third depth is in a range from about 10 nm to about 200 nm.

15. The mold of claim 1, wherein the third depth is in a range from about 10 nm to about 200 nm.

16. The mold of claim 15, wherein the first depth is in a range from about 10 nm to 200 nm or the second depth is in a range from about 10 nm to about 200 nm.

* * * * *